United States Patent [19]

Tanaka et al.

[11] Patent Number: 4,702,990
[45] Date of Patent: Oct. 27, 1987

[54] PHOTOSENSITIVE RESIN COMPOSITION AND PROCESS FOR FORMING PHOTO-RESIST PATTERN USING THE SAME

[75] Inventors: Akinobu Tanaka; Masao Morita; Saburo Imamura, all of Mito; Toshiaki Tamamura, Katsuta; Osamu Kogure, Mito, all of Japan

[73] Assignee: Nippon Telegraph and Telephone Corporation, Tokyo, Japan

[21] Appl. No.: 733,505

[22] Filed: May 10, 1985

[30] Foreign Application Priority Data

May 14, 1984 [JP] Japan ................................ 59-94620
Feb. 18, 1985 [JP] Japan ................................ 60-28250

[51] Int. Cl.$^4$ .......................... G03C 1/54; G03C 1/60
[52] U.S. Cl. .................................. 430/197; 430/287; 430/285; 522/99; 522/18; 522/65; 522/13; 522/17; 522/34; 522/39; 522/59; 522/49; 522/62; 522/24; 522/27; 522/28
[58] Field of Search ..................... 430/287, 285, 197; 204/159.13; 522/99, 18, 65, 13, 17, 34, 39, 59, 49, 62, 6, 24, 27, 28

[56] References Cited

U.S. PATENT DOCUMENTS

| | | | |
|---|---|---|---|
| 3,695,886 | 10/1972 | Clecak et al. | 430/287 X |
| 3,969,543 | 7/1976 | Roberts et al. | 430/330 X |
| 4,041,190 | 8/1977 | Dubois et al. | 430/330 X |
| 4,292,398 | 9/1981 | Rubner et al. | 430/197 X |
| 4,469,778 | 9/1984 | Iwayanagi et al. | 430/197 X |
| 4,507,384 | 3/1985 | Morita et al. | 204/159.13 X |

FOREIGN PATENT DOCUMENTS

| | | | |
|---|---|---|---|
| 60525 | 6/1974 | Japan | 430/197 |
| 168247 | 10/1982 | Japan | 430/270 |

OTHER PUBLICATIONS

T. Iwayanagi et al, "Azide Photoresists for Deep U.V. Lithography", *Journal of the Electrochemical Society*(USA), vol. 127, No. 12, Dec. 1980, pp. 2759-2760.

T. Tsunoda et al, "Spectral Sensitization of Bisazide Compounds", *Photographic Science and Engineering*, vol. 17, No. 4, Jul./Aug. 1973, pp. 390-393.

Microcircuit Engineering 81, Sep. 28-30, 1981, Switzerland, Swiss Federal Institute of Technology Lausenne. Hatzakis et al, "Double Layer Resist Systems for High Resolution Photography", Provisional Program, No. 386, IBM, Thomas J. Watson Research Center, (11 pages).

Tanaka et al, "Preparation and Resolution Characteristics of a Novel Silicon Based Negative Resist", 127th Meeting of American Chemical Society at St. Louis, Apr. 8-13, 1984.

*Primary Examiner*—John E. Kittle
*Assistant Examiner*—Cynthia Hamilton
*Attorney, Agent, or Firm*—Frishauf, Holtz, Goodman & Woodward

[57] ABSTRACT

The present invention provides a photosensitive resin composition used to form a top resist layer of a multilayer resist system, the composition comprising a photosensitive polyphenylsilsesquioxane represented by the following general formula (I) of:

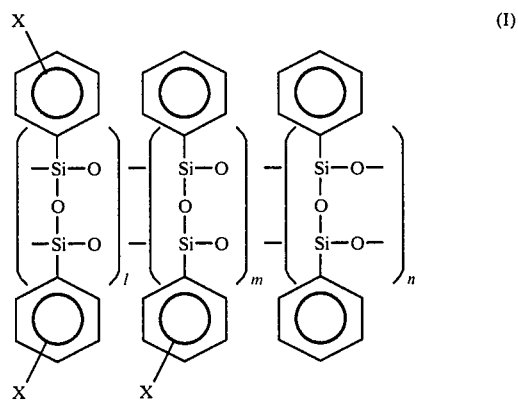

wherein X is selected from the group consisting of acryloyloxymethyl, methacryloyloxymethyl, and cinnamoyloxymethyl; and l, m and n are zero or positive integers but l and m do not take the value of zero simultaneously; and a bisazide compound added to act as a cross-linking agent.

The photosensitive resin composition has high sensitivity to UV light and excellent resistance to reactive ion etching under oxygen gas ($O_2$ RIE).

5 Claims, 2 Drawing Figures

PHOTOSENSITIVE RESIN COMPOSITION AND PROCESS FOR FORMING PHOTO-RESIST PATTERN USING THE SAME

BACKGROUND OF THE INVENTION

1. Field of the Invention

The present invention relates to a photosensitive resin composition used in the production of semiconductors, magnetic bubbling elements and parts for an apparatus of applied optics. It also relates to a process for forming a photo-resist pattern using the photosensitive resin composition described above.

2. Prior Art

In the production of LSI elements, it has been recommended to use double layer photo-resist systems in order to form a highly accurate pattern having a high aspect ratio (i.e. the value obtained by dividing the thickness of resist layer by the width of pattern). Such recommendations or proposals were made by, for example, "MICROCIRCUIT ENGINEERING 81", Sept., 28-30, 1981, Switzerland, and "Provisional Program", No. 386, "Double Layer Resist Systems for High Resolution Lithography", IBM, Thomas J., Watson Research Center, Yorktown Heights, New York, 10598. In the double layer resist systems, a thin top resist layer is applied over a bottom resist layer made of an organic polymer material, and a pattern is initially formed on the top resist layer. Then, the bottom resist layer is etched by reactive ion etchig under oxygen gas (hereafter referred to as $O_2$ RIE resistance), while using the pattern formed on the top resist layer as a mask, to form a double layer resist pattern. The top resist layer used in such a system must be excellent in durability or excellent $O_2$ RIE resistance, and must have a high sensitivity and high resolution power.

To meet the aforementioned requirements, photo-resist materials including silicon-containing polymers, which are excellent in durability in $O_2$ RIE resistance, introduced with high photosensitive groups were regarded as favorable materials. However, the known polysiloxane photo-resist materials having low molecular weights and glass transition temperatures lower than the room temperature are liquid and thus pose difficult handling problems when used to form photo-resist layers. An additional disadvantage of this class of photo-resist materials is low sensitivity to high energy rays. On the other hand, the known polysiloxane photo-resist materials having high molecular weights are rubber-like substances and tend to swell in developer solvents to deform patterns, resulting in deterioration of resolution characteristics. It has been found difficult to form a pattern of high resolution by the use of a double layer photo-resist in which a high molecular weight polysiloxane resist is used in the top layer.

A negative electron-beam resist material for electron beam irradiation process prepared from polydiphenylsiloxane by introducing negative chloromethyl groups in the benzene rings of polydiphenylsiloxane as the main chain through chloromethylation, was reported at the 127th Meeting of American Chemical society (Apr. 8 to 13 day (1984), St. Louis) under the title of "Preparation and Resolution Characteristics of a Novel Silicon Based Negative Resist". The negative resist for electron beam irradiation has a high sensitivity and excellent resistance to reactive ion etching under oxygen gas ($O_2$ RIE). However, this resist is not so sensitive to ultraviolet (UV) light which is the type of light widely used for VLSI production because of its high through-put.

OBJECTS AND SUMMARY OF THE INVENTION

An object of this invention is to provide a photosensitive resin composition which is highly sensitive to ultraviolet (UV) lights and has a high resolution power and which is also has excellent $O_2$ RIE resistance.

Another object of this invention is to provide a process for forming pattern in a double layer resist systems using, as the top layer, a photosensitive resin composition comprising a polymer component of a polyphenylsilsesquioxane and/or polyphenylsiloxane having photosensitive substituents and a bisazide compound added to said polymer component and the sensitizer, the resin composition being highly sensitive to UV light and having a high glass transition temperature and an improved resistance to $O_2$ RIE.

The photosensitive resin composition provided by the invention comprises:

a photosensitive substituted polyphenylsilsesquioxane represented by the following general formula (I) or polyphenylsiloxane represented by the following general formula (III) of:

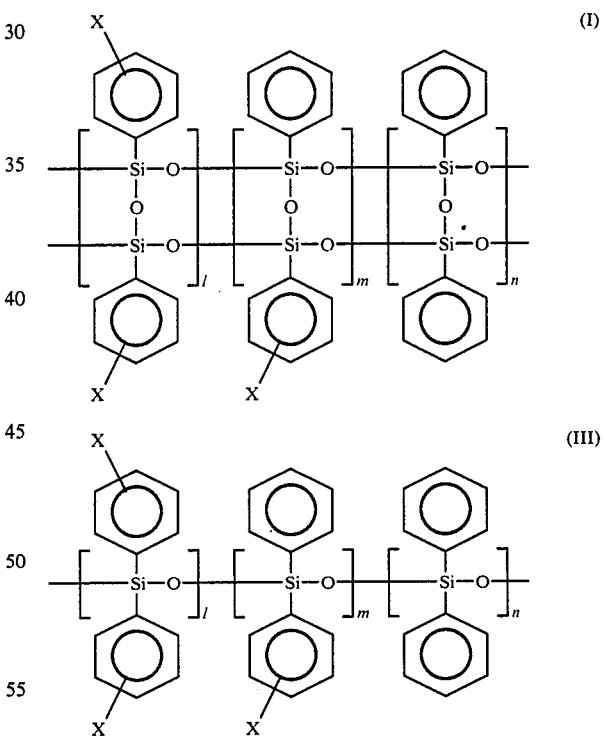

wherein X is selected from the group consisting of acryloyloxymethyl ($-CH_2-O-CO-CH=CH_2$), methacryloyloxymethyl ($-CH_2-O-CO-C(CH_3)=CH_2$) and cinnamolyloxymethyl ($-CH_2-O-CO-CH=CH-C_6H_5$); and 1, m and n are zero or positive integers but 1 and m do not take the value of zero simultaneously; and one or more bisazide compounds selected from the group consisting of the compounds represented by the following general formula (II) of:

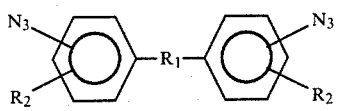

(II)

wherein R₁ shows a direct carbon-carbon bond between the benzene rings or a group represented by —CH₂—, —O—, —CH=CH—, —N=N—, —S—, —SO₂—, —CO, —CH=CH—CO—CH=CH— (benzalacetone),

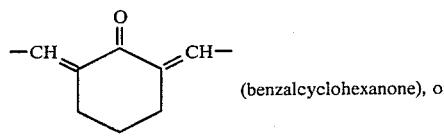

(benzalcyclohexanone), or

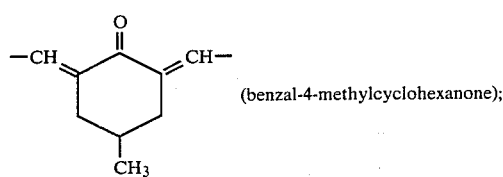

(benzal-4-methylcyclohexanone);

and R₂ is hydrogen or halogen atom.

Further provided by this invention is an improved process wherein the photosensitive polyphenylsilsesquioxane-bisazide composition and the photosensitive polyphenylsiloxane-bisazide composition, described above, and the sensitizer is used in the top resist layer in a double layer photo-resist processing. In the process, according to this invention, a bottom resist layer (e.g. a novolak resin) which has excellent resistance to dry etching under carbon fluoride gas such as a CF₄ gas, is applied on a substrate, and a top resist layer is formed by applying the photosensitive composition of the invention which is irradiated by UV light through a photomask followed by development to form a pattern in the top resist layer carried by the bottom resist layer, and finally the pattern in the top resist layer is transferred onto the bottom layer through oxygen O₂ RIE.

DESCRIPTION OF THE PREFERRED EMBODIMENTS

Figure 1:
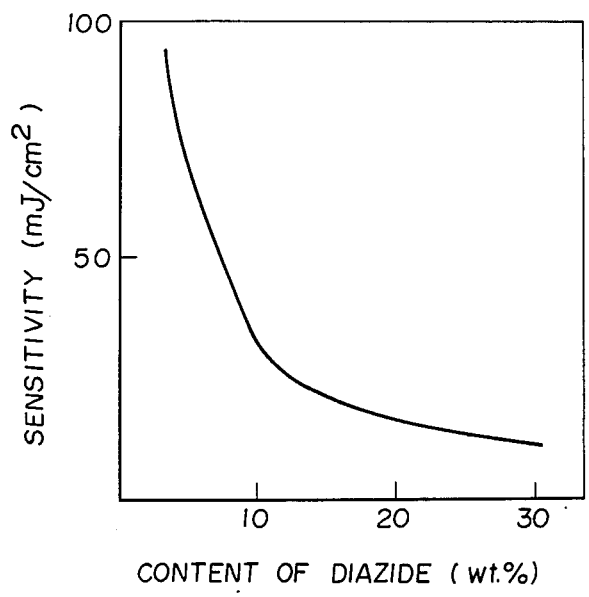
FIG. 1 is a graph showing the interrelation between the sensitivity of the resist and the change in added quantity of 20% substituted methacryloyloxymethylphenylpolysiloxane/2,6-di-(4'-azidobenzal)-4-methylcyclohexanone.

The photosensitive polyphenylsilsesquioxane contained in the photosensitive resin composition of the invention is synthesized through the following process.

A silane compound represented by C₆H₅—SiZ₃ (wherein Z is Cl or OCH₃) first is hydrolyzed to obtain a polyphenylsilsesquioxane. The polyphenylsilsesquioxane is dissolved in chloromethyl methyl ether and added with stannic chloride (SnCl₄) dropwise as a catalyst, to obtain chloromethyl polyphenylsilsesquioxane. The chloromethyl polyphenylsilsesquioxane is then reacted with potassium acrylate, potassium methacrylate and potassium cinnamate to substitute the chlorine of the chloromethyl groups in the chloromethyl polyphenylsilsesquioxane, respectively, by acryloyloxy groups —O—CO—CH=CH₂, methacryloyloxy groups —O—CO—C(CH₃)=CH₂ and cinnamoyloxy groups —O—CO—CH=CH—C₆H₅, whereby acryloyloxymethyl polyphenylsilsesquioxane, methacryloyloxymethyl polyphenylsilsesquioxane and cinnamoyloxymethyl polyphenylsilsesquioxane are prepared.

Chloromethylphenyltrichlorosilane (ClCH₂—C₆H₄—SiCl₃) second may be used, as a starting material, and hydrolyzed to prepare a phenylsilsesquioxane polymer having a chloromethylation conversion ratio of 100%. The chlorine of the chloromethyl groups of the chloromethylated phenylsilsesquioxane polymer may be substituted by acryloyloxy groups, methacryloyloxy groups and cinnamoyloxy groups, similarly in the aforementioned process, whereby polyphenylsilsesquioxane having a 100% substitution ratio may be prepared.

Furthermore, chloromethylphenyltrichlorosilane and phenyltrichlorosilane third may be dissolved in a solvent and then hydrolyzed to prepare a co-condensation polymer. The ratio of chloromethylation of the chloromethylated polymer may be conveniently changed by varying the quantity of the added chloromethylphenyltrichlorosilane. Thereafter, the polymer is dissolved in a solvent and chlorine of the chloromethyl groups substituted by acryloyloxy groups, methacryloyloxy groups and cinnamoyloxy groups, similarly as in the aforementioned process.

In preparation of a photosensitive polysiloxane, a cyclic phenylsiloxane, such as hexaphenyl cyclotrisiloxane and octaphenyl cyclotetrasiloxane, is subjected to ring-opening-polymerization using an hydroxide of alkali metal, such as potassium hydroxide, or an alkylation compound of a alkali metal, such as lithium butylate. The thus prepared polydiphenylsiloxane is dissolved in chloromethyl methyl ether to obtain a solution into which stannic chloride (SnCl₄) is added, as a catalyst, to chloromethlate the polydiphenylsiloxane, whereby a chloromethyl phenylpolysiloxane is obtained. The chloromethyl phenylpolysiloxane may be reacted, respectively, with potassium acrylate, potassium methacrylate and potassium cinnamate so that chlorine of the chloromethyl groups are substituted by acryloyloxy, methacryloyloxy and cinnamoyloxy groups.

Examples of usable bisazide compounds include 3,3'-dichloro-4,4'-diazidodiphenylmethane, 4,4'-diazidodiphenyl ether, 4,4'-diazidodiphenyl methane, 4,4'-diazidodiphenyl sulfone, 3,3'-diazidodiphenyl sulfone and 4,4'-diazidodiphenyl ketone. It is preferred that any of these bisadide compounds is added to the photosensitive substituted polyphenylsilsesquioxane or photosensitive substitued phenylpolysiloxane in an amount, based on the weight of the latter, of 0.5 to 30 wt %. If the amount of added bisazide compound is less than 0.5 wt %, cross-linking reaction does not take place in the resultant photo-resist even when exposed to the light. On the contrary, if the amount of added bisazide compound is more than 30 wt%, the stability after long storage time is lowered and the coatability is adversely affected.

The photosensitive resin composition of the invention may be added with a sensitizer. The UV light having the wavelengths within the usable wavelength range are absorbed by the photosensitive composition to decompose the bisazide compound which releases $N_2$ to form a residue having nitrene radical (—N.). The thus formed residual radical adds, for instance, to the double bond of— $C(CH_3)=CH_2$ of the methacyloyl group to effect cross-linking. The sensitizer acts to enhance the absorption of UV light. Sensitizers, which may be added to the composition of the invention, include benzoin based compounds, such as benzoin methyl ether; azo-compounds, such as azobisisobutylonitrile; chromoredox compounds, such as the combinations of dyestuffs including chlorophyl, Methylene Blue and Eosine Yellow with a reducing agent including sodium p-toluenesulfinate; sulfur-containing compound, such as dibenzothiazoyl disulfide; organic peroxides, such as benzoyl peroxide; aromatic carbonyl compounds, such as benzophenone and Michler's ketone; aromatic nitro-compounds, such as nitrobenzene, p-nitrophenol and p-nitroaniline; quinone compounds, such as anthraquinone; acenaphthene compounds, such as 5-nitroacenaphthene; and anthrone compounds.

The photosensitive resin composition of the invention has high sensitivity to UV light and has an excellent resistance to dry etching under etchant gas, such as oxygen gas, carbon tetra chloride and $CF_2Cl_2$, used for reactive ion etching.

The process for forming a photo-resist pattern, according to the present invention, comprises the step of forming a bottom or undercoat resist layer of an organic polymer material having excellent resistance to $CF_4$ gas dry etching on a substrate against etchant on the working of the substrate, the step of applying a top or overcoat resist layer having excellent resistance to $O_2$ RIE on the bottom resist layer, the step of forming a top resist pattern by irradiating UV light through a photo mask followed by development, and transferring the top resist pattern to the bottom resist layer through $O_2$ RIE. In the double-layer resist pattern forming process, mentioned immediately before, the photosensitive resin composition of the invention may be used to form the top resist layer, the photosensitive resin composition of the invention may be used to form the top resist layer, the photosensitive resin composition being characterized by the use of either one of the combination of a polyphenylsilsesquioxane with a bisazide compound or the combination of a polyphenylsiloxane with a bisazide compound or these composition added the sensitizer.

Since the top resist layer prepared in accordance with the present invention is made of a resinous composition containing a large amount of phenyl groups as the constitutional groups, it has a high glass transition temperature. If the content of phenyl groups is less than 75%, the composition becomes gummy, leading to failure in preparation of a resist layer or coating having high glass transition temperature. By the introduction of high photosensitive groups, i.e. acryloyloxymethyl, methacryloyloxymethyl and cinnamoyloxymethyl groups in the instant invention, the bisazide acting to form cross-linking bonds by UV light irradiation, the composition is provided with convenient characteristics for use as a negative photo-resist forming material for the UV light. Since the polyphenylsilsesquioxane and polyphenylsiloxane structures including silicon-oxygen bonds in the main chain thereof provide excellent resistance to $O_2$ RIE, the composition of the invention can be conveniently used for the top resist layer in a double layer photo-resist processing. As has been described above, the photosensitive acryloyloxymethyl, methacryloyloxymethyl and cinnamolyloxymethyl groups may be added or introduced to the phenyl groups through the initial introduction of chloromethyl groups. Introduction of chloromethyl groups to the phenyl groups is closely related with the introduction of photosensitive groups. The chloromethylation degree of the photosensitive resin composition and the resultant photo-resist, according to the invention, may be controlled in the manner as aforementioned, and the introduction ratio of photosensitive groups may be easily controlled, accordingly. The sensitivity of the resultant photo-resist coating becomes higher as the introduction ratio of photosensitive groups is increased. However, as known in the art, the resistance to $O_2$ RIE of the resist coating is lowered with the increase in introduction ratio of photosensitive groups. It was valuable in practice to increase the content of photosensitive group which satisfies above-mentioned both properties.

Figure 2:
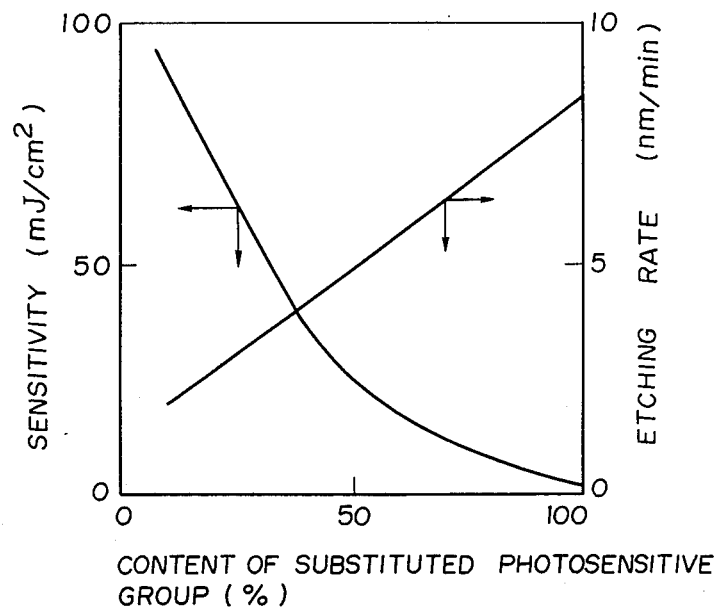
FIG. 2 is a graph showing the change in sensitivity of the photo-resist and the change in resistance to O₂ RIE in terms of the change the content of photosensitive groups in a 48% substituted methacryloyloxymethyl polyphenylsilsesquioxane.

In this connection, FIG. 2 is a graph showing the interrelation of the sensitivity (indicated by $mJ/cm_2$ along the ordinate) and the resistance to $O_2$ RIE (indicated by nm/min along the ordinate) in terms of the introduction ratio (indicated by % along the abscissa) of the photosensitive groups in the methacryloyloxymethyl polyphenylsilsesquioxane with 5 wt % of 2,6-di-(4'-azidobenzal)-4-methylcyclohexanone being added in the composition.

The resistance to $O_2$ RIE was appraised by applying the resin composition to form a resist coating on a silicon substrate, and measuring the thicknesses of the coating before and after the etching operation. The etching was carried out in a parallel plate type etching apparatus. Etching conditions are following: $O_2$ gas pressure 10 m Torr, PH power 50 W. The $O_2$ RIE resistance is represented by the etching rate (by nonameter/minute) in this instance. In order to learn or determine the sensitivity of the resultant photo-resist when it is irradiated by UV light, a resist coating having a thickness of about $0.2\mu m$ was formed by spin coating on a thermally oxidized silicon substrate followed by irradiation with UV light, whereupon the UV light was absorbed by the resist coating so that the residual radicals released from the bisazide compound and containing free radical nitrene radicals (—N.) are added to the double bonds of the photosensitive groups to effect cross-linking and gelation. The sensitivity was indicated by the exposure dose of irradiation at which the gellation extent reached 50%. It is considered that the sensitivity requisite for practical application as a top resist layer is not more than 90 $mJ/cm^2$, and likewise the pertinent etching rate for the top resist layer is not more than 5 nonameters/minute. Accordingly, by referring to FIG. 2, it is considered preferable that the percentage introduction ratio of the photosensitive groups (Number of Photosensitive Groups X/Number of Benzene Ring) is in the range of 10 to 50%.

The photosensitive resin composition of this invention has a further advantage that the resultant photo-resist coating can be extremely easily removed.

In this invention, solvents such as methyl ethyl ketone and aromatic hydrocarbone solvents such as xylene are useful for developer. However xylene is more useful according to the below-mentioned reason.

Organic polymer material, such as a phenol novolak resin, having excellent dry etching resistance to $CF_4$ gas RIF may be used as the bottom resist layer. When such a bottom resist layer is baked at a temperature of higher than 150° C., the baked resist coating becomes insoluble in a polar solvent, such as methyl ethyl ketone. For this reason, if it is desired to remove the bottom resist layer, removal must be effected through ashing. However, since a polyphenylsilsesquioxane coating which is excellent in $O_2$ RIE is present as the top resist layer, it is difficult to remove the double layer resist coating.

In the process for forming a pattern, according to the present invention, an aromatic hydrocarbon, such as xylene and chlorobenzene, or a mixed solvent composed of an aromatic hydrocarbon and an alicyclic compound, such as methylcyclohexane, may be used as the developer solvent. Therefore, in the process for forming a pattern according to the invention, the bottom resist coating can be formed by baking the same at a lower temperature of not higher than 100° C. to form a bottom resist coating which is not dissolved during the step of developing the top photo-resist layer. When the bottom photo-resist coating is baked at a low temperature as aforementioned, a ketone solvent can be used as the solvent for removing the bottom resist coating since it is readily dissolved in a ketone solvent. As a result, no resist dregs are left on the substrate. The developing step may include rinsing, if necessary. Alicyclic componds, such as methylcyclohexane, which do not dissolve the top resist coating and the bottom resist layer baked at a low temperature, are exemplary solvents usable for this purpose.

In the double layer resist systems, it is important that the resist patterns be removed completely after the substrate has been finished. According to the present invention, the photo-resist patterns may be easily removed from the substrate by the use of a polar solvent.

EXAMPLE 1

Synthesis of Photosensitive Polyphenylsilsesquioxane 7 g of phenyltrichlorosilane was dissolved in 20 ml of N-methylpyrrolidone, and then added with 10 ml of water and 5 ml of concentrated hydrochloric acid allowed to react at 30° C. for 24 hours, whereby a precipitate was formed. After rinsing the precipitate with water, the precipitate was dissolved in 20 ml of tetrahydrofuran, and the resultant solution was poured slowly into methanol to obtain 8 g of a white precipitate of polyphenylsilsesquioxane.

The polyphenylsilsesquioxane was refined by repeated reprecipitation in tetrahydrofuran-methanol, and then dried in vacuum. The thus refined plyphenylsilsesquioxane had a weight average molecular weight $\overline{Mw}=1.7\times10^4$ which had been calculated from the result of gel permeation chromatography. The molecular weight distribution $\overline{Mw}/\overline{Mn}$ thereof was calculated, from the above value and the number average molecular weight $\overline{Mn}$ to know that $\overline{Mw}/\overline{Mn}=1.8$.

8 g of the polyphenylsilsesquioxane was dissolved in 250 ml of chloromethyl methyl ether and added with 10 ml of stannic chloride ($SnCl_4$) dropwise as a catalyst, followed by chloromethylation at $-5°$ C. for 10 hours. The resultant reaction solution was poured into methanol to obtain chloromethyl polyphenylsilsesquioxane in white solid form. The result of ultimate analysis of the polymer revealed that the chloromethylation degree of the polymer was 45%. The weight average molecular weight $\overline{Mw}$ of the polymer was calculated from the result of gel permeation chromatography to learn that $\overline{Mw}=2.0\times10^4$, and the molecular weight distribution $\overline{Mw}/\overline{Mn}=1.9$.

After dissolving, 5 g of the thus prepared 45% substitution chloromethyl polyphenylsilsesquioxane was dissolved in 70 ml of dimethylformamide (DMF), 0.9 g of ethyltrimethylammonium iodide and 6 g of potassium methacrylate were added to react at 30° C. for 12 hours. The resultant reaction solution was poured into methanol to obtain a 45% substitution methacryloyloxymethyl polyphenylsilsesquioxane.

EXAMPLE 2

The 45% sustituted chloromethyl polyphenylsilsesquioxane prepared in Example 1 was subjected to substitution reaction under the same conditions as described in Example 1, except that potassium acrylate was used in place of potassium methacrylate, to prepare a 45% substituted acryloyloxymethyl polyphenylsilsesquioxane.

EXAMPLE 3

The 45% substituted chloromethyl polyphenylsilsesquioxane prepared in Example 1 was subjected to substitution reaction under the same conditions as described in Example 1, except that potassium cinnamate was used in place of potassium methacrylate, to prepare a 45% substituted cinnamoyloxymethyl polyphenylsilsesquioxane.

EXAMPLE 4

After dissolving 35 g of chloromethylphenyltrichlorosilane in 100 ml of N-methylpyrrolidone and adding with 50 ml of water and 25 ml of concentrated hydrochloric acid, the solution was allowed to stand for polymerization at 25° C. for 24 hours. After rinsing the resultant precipitate with water, the precipitate was dissolved in 100 ml of tetrahydrofuran and the solution was slowly poured into methanol to obtain 43 g of white precipitate of polyphenylsilsesquioxane having 100% chloromethylation degree. The thus prepared polymer was refined and then subjected to determination through a gel permeation chromatography to obtain the results of $\overline{Mw}=1.0\times10^4$ and $\overline{Mw}/\overline{Mn}=1.8$.

5 g of the thus prepared 100% substituted chloromethylated polyphenylsilsesquioxane was dissolved in 70 ml of DMF to obtain a solution, to which were added 0.8 g of ethyltrimethylammonium iodide and 7 g of potassium methacrylate. After reacting at 30° C. for 12 hours, the reaction solution was poured into methanol to obtain methacryloyloxymethyl polyphenylsilsesquioxane having a substitution degree of 100%.

EXAMPLE 5

The 100% substituted chloromethyl polyphenylsilsesquioxane prepared by Example 4 was subjected to substitution reaction under the same conditions as in Example 4, except that potassium acrylate was used in place of potassium methacrylate to prepare a 100% substituted acryloyloxymethyl polyphenylsilsesquioxane.

EXAMPLE 6

The The 100% substituted chloromethyl polyphenylsilsesquioxane prepared by Example 4 was subjected to substitution reaction under the same conditions as in Example 4, except that potassium cinnamate was used in place of potassium methacrylate to prepare a 100% substituted cinnamoyloxymethyl polyphenylsilsesquioxane.

EXAMPLE 7

After dissolving 15 g of chloromethylphenyltrichlorosilane and 20 g of phenyltrichlorosilane in 100 ml of N-methylpyrrolidone, 50 ml of water and 25 ml of concentrated hydrochloric acid were added to the mixture solution which was maintained at 25° C. for 24 hours for copolymerization. After rinsing the thus formed precipitate with water, the precipitate was dissolved in 100 ml of tetrahydrofuran to obtain a solution, to which methanol was slowly added to prepare chloromethyl polyphenylsilsesquioxane. After refining the thus prepared polymer, it was subjected to ultimate analysis to affirm that the chloromethylation degree thereof was 43%.

5 g of the 43% substituted chloromethyl polyphenylsilsesquioxane was dissolved in 70 ml of DMF to prepare a solution, to which 0.9 g of ethyltrimethylammonium iodide and 7 g of potassium methacrylate were added and the polymer was subjected to reaction at 30° C. for 12 hours. The resultant reaction solution was then poured into methanol to obtain a 43% substituted methacryloyloxymethyl polyphenylsilsesquioxane.

EXAMPLE 8

The 43% substituted chloromethyl polyphenylsilsesquioxane prepared by Example 7 was subjected to substitution reaction under the same conditions as in Example 7, except that potassium acrylate and potassium methacrylate were used to prepare a 43% substituted acryloyloxymethyl polyphenylsilsesquioxane and a 43% substituted cinnamoyloxymethyl polyphenylsilsesquioxane.

EXAMPLE 9

Synthesis of Photosensitive Phenylpolysiloxane 10 g of hexaphenylcyclotrisiloxane was dissolved in 100 ml of toluene, and 5 ml of a 10% lithium butylate solution in toluene was added dropwisely in a sufficiently deaerated and dehydrated condition at −6° C. for 10 hours for living polymerization. The resultant reaction solution was poured into methanol to obtain a white solid polymer. The polymer was dissolved in methyl ethyl ketone and then precipitated again in methanol to purify the same. The thus purified polymer was dried in vacuum. The resultant polymer was subjected to gel permeation chromatography and the weight average molecular weight and the molecular weight distribution were calculated to find that $\overline{Mw}=8.9\times 10^3$ and $\overline{Mw}/\overline{Mn}=1.1$.

10 g of phenylpolysiloxane was dissolved in 250 ml of chloromethyl methyl ether and 10 ml of stannic chloride ($SnCl_4$) was added dropwisely as a catalyst to chloromethylate the phenylpolysiloxane at −5° C. for 10 hours. The resultant reaction solution was pored into methanol to obtain chloromethylphenyl polysiloxane. For the result of ultimate analysis thereof, it was found that the chloromethylation degree was 20%. After dissolving 5 g of chloromethylphenyl polysiloxane in 70 ml of DMF, 0.9 g of ethyltriethylammonium iodide and 5 g of potassium methacrylate were added and the admixture was allowed to stand at 30° C. for 12 hours for substition reaction. The reaction solution was then poured into methanol to obtain 4 g of methacryloyloxymethylphenyl polysiloxane having a substitution ratio of 20%.

EXAMPLE 10

The methacryloyloxymethylphenyl polysiloxane having a substitution ratio of 20% was subjected to substitution reaction similarly as in Example 9, except that potassium methacrylate was used in place of potassium acrylate to preparae acryloyloxymethylphenyl polysiloxane having a substituion ratio of 20%.

EXAMPLE 11

The methacryloyloxymethylphenyl polysiloxane having a substitution ratio of 20% was subjected to substitution reaction similarly as in Example 9, except that potassium cinnamate was used in place of potassium acrylate to prepare cinnamoyloxymethylphenyl polysiloxane having a substitution ratio of 20%.

EXAMPLE 12

2 g of the methacryloyloxymethyl polyphenylsilsesquioxane having a substitution ratio of 45% prepared by Example 1 was dissolved in 10 ml of chlorobenzene, and added with 100 mg of 2,6-di(4'-azidobenzal)-4-methylcyclohexanone acting as a cross-linking agent and 10 mg of Michler's ketone acting as a sensitizer. The admixture solution was coated on a quartz plate to form a thin coating having a thickness of about 0.5 μm. The coating was subjected to prebaking at 80° C. for 20 minutes in a nitrogen stream. After the prebaking, the coating was exposed to irradiation from an ultra high pressure mercury lamp in a nitrogen gas atmosphere through a mask of Kodak Photographic Step Tablet. After the exposure to irradiation, the thin coating on the quartz plate was developed by methyl ethyl ketone for 20 seconds. The necessary irradiation dose for leaving 50% in thickness of the initial coating after the aforementioned processing was 50 $mJ/cm^2$. The value corresponded to a sensitivity for using the coating as a practically satisfactory photo-resist. Another experiment was conducted, wherein the coating was exposed to an UV light irraditation through a chromium mask having a pattern including lines and spaces of less than 10 μm in width, followed by development using the developer liquid having the same composition as described above, to reveal that the pattern of the mask was resoluted on the thin coating at high fidelity.

EXAMPLE 13

The irradiation and development steps were repeated under the same condition as described in Example 12, except that the photosensitive substituted polyphenylsilsesquioxanes and the photosensitive substituted phenylpolysiloxanes prepared in Examples 2 to 11 were used in place of the 45% substituted methacryloyloxymethylphenylsilsesquioxane as used in Example 12. The necessary irradiation doses for leaving 50% in thickness of the initial coatings are shown in Table 1. Each of the coatings was also exposed to UV lights through a chromium mask having a pattern including lines spaces of less than 10 μm in width, followed by development to reveal that the pattern of the mask was resoluted by each photosensitive resin composition at high fidelity.

TABLE 1

| Run No. | Photosensitive Polymer | Dose ($mJ/cm^2$) |
|---|---|---|
| 1 | 45% substituted Methacryloyloxymethyl Polyphenylsilsesquioxane | 40 |

TABLE 1-continued

| Run No. | Photosensitive Polymer | Dose (mJ/cm$^2$) |
| --- | --- | --- |
| 2 | 45% substituted Acryloyloxymethyl Polyphenylsilsesquioxane | 35 |
| 3 | 45% substituted Cinnamoyloxymethyl Polyphenylsilsesquioxane | 45 |
| 4 | 100% substituted Methacryloyloxymethyl Polyphenylsilsesquioxane | 5 |
| 5 | 100% substituted Acryloyloxymethyl Polyphenylsilsesquioxane | 5 |
| 6 | 100% substituted Cinnamoyloxymethyl Polyphenylsilsesquioxane | 8 |
| 7 | 43% substituted Methacryloyloxymethyl Polyphenylsilsesquioxane | 30 |
| 8 | 43% substituted Acryloyloxymethyl Polyphenylsilsesquioxane | 20 |
| 9 | 43% substituted Cinnamoyloxymethyl Polyphenylsilsesquioxane | 40 |
| 10 | Methacryloyloxymethylphenyl Polysiloxane | 50 |
| 11 | Acryloyloxymethylphenyl Polysiloxane | 45 |
| 12 | Cinnamoyloxymethylphenyl Polysiloxane | 55 |

EXAMPLE 14

The 100% substituted chloromethylpolyphenylsilsesquioxane prepared in Example 4 was subjected to substitution reaction using potassium methacrylate and ethyltrimethyl-ammonium iodide to obtain 100% methacryloyloxymethyl polyphenylsilsesquioxane which was used as a phtosensitive polymer and added with 2,6-di-(4'-diazidobenzal)-4-methylhexanone as a crosslinking agent and also with Michler's ketone as a sensitizer, whereby a mixed solution was prepared. The mixed solution was applied to form a thin coating which was exposed to UV lights irradiation followed by development to find that the irraditation does necessary for leaving 50% in thickenss of the initial coating was 5 mJ/cm$^2$ (in this connection, reference should be made to Run No. 4 in Table 1). The photosensitive polymer of Run No. 4, 100% substituted methacryloyloxymethyl polyphenylsilsesquioxane, were added with diazide compounds other than 2,4-di(4'-diazidobenzal)-4-methylhexanone to prepare coating materials, similarly as in the preceding Example. Following procedures were the same as described above to learn the irradiation doses necessary for leaving 50% in thickness of the initial coatings, respectively. The results are shown in Table 2. The used light source was an ultra high pressure mercury lamp of 3 KW.

TABLE 2

Photosensitive Polymer: 100% substituted Methacryloyloxymethyl Polyphenylsilsesquioxane

| Run No. | Diazide Compound | Dose (mJ/cm$^2$) |
| --- | --- | --- |
| 1 | 2,4-Di-(4'-diamidobanzal)-4-methyl Hexanone | 5 |
| 2 | 4,4'-Diazidodiphenyl Ether | 10 |
| 3 | 4,4'-Diazidodiphenyl Sulfone | 12 |
| 4 | 3,3-Diazidodiphenyl Methane | 8 |
| 5 | 3,3-Diazidodiphenyl Sulfone | 8 |
| 6 | 4,4-Diazidodiphenyl Acetone | 6 |
| 7 | 2,6-di-(4'-azidobenzal) Cyclohexane | 5 |
| 8 | 3,3'-dichloro-4,4'-diazidodiphenyl Methane | 8 |

EXAMPLE 15

5 wt % of 2,6-di-(4'azidobenzal)-4-methyl cyclohexanone was added to the 43% substituted methacryloxymethyl polyphenylsesquioxane to prepare a photosensitive resin, from which a coating was formed. The irradiation dose necessary for leaving 50% in thickness of the initial coating was 30 mJ/cm$^2$ (see Run. No. 7 in TABLE 1). Similar procedures were repeated as for Run No. 7, except that other diazide compounds were used in place of 2,6-di-(4'azidobanzal)-4-methyl cyclohexanone as used in Run No. 7, to form coatings which were exposed to UV lights irradiation followed by development. The irradiation doses necessary for leaving 50% in thickness of respective initial coatings are shown in TABLE 3.

TABLE 3

Photosensitive Polymer: 43% substituted Methacryloyloxymethyl-polyphenylsilsesquioxane

| Run No. | Diazide Compound | Dose (mJ/cm$^2$) |
| --- | --- | --- |
| 1 | 4,4'-Diazidodiphenyl Ether | 60 |
| 2 | 4,4'-Diazidodiphenyl Sulfone | 70 |
| 3 | 4,4'-Diazidodiphenyl Methane | 50 |
| 4 | 3,3'-Diazidodiphenyl Sulfone | 50 |
| 5 | 3,3'-Diazidodiphenyl Methane | 40 |
| 6 | 4,4'-Diazidodibenzal Aceton | 40 |
| 7 | 2,6-di(4'-azidobenzal) Cyclohexane | 30 |
| 8 | 3,3'-dichloro-4,4'-diazidodiphenyl Methane | 50 |

EXAMPLE 16

2 g of the 100% substituted methacryloyloxymethyl polyphenylsilsesquioxane prepared by Example 4 was dissolved in 10 ml of chlorobenzene, and added with 100 mg of 2,4-di-(4'-azidobenzal)-4-methyl cyclohexanone as a cross-linking agent and further added with 10 mg of each of different sensitizers. The sensitivities of the thus prepared photosensitive resin compositions are shown in terms of the irradiation doses necessary for leaving 50% in thickness of the initial coatings in TABLE 4.

TABLE 4

Photosensitive Polymer: 100% substituted Methacryloyloxymethyl
Cross-Linking Agent: 2,4-di(4'-azidobenzal)-4-methyl cyclohexanone

| Run No. | Sensitizer | Dose (mJ/cm$^2$) |
| --- | --- | --- |
| 1 | 5-Nitroacenaphthene | 4 |
| 2 | 2-Nitrofluorene | 5 |
| 3 | 1-Nitropyrene | 6 |
| 4 | 1,8-Dinitropyrene | 6 |
| 5 | 1,2-Benzoanthraquinone | 5 |
| 6 | Pyrene-1,6-quinone | 4 |
| 7 | Cyanoacrydine | 6 |

EXAMPLE 17

The photosensitive resin compositions of the present invention were tested to learn the resistances thereof to dry etching under various reactive gases. The 100% substituted methacryloyloxymethyl polyphenylsilsesquioxane prepared by Example 4 was used as a photosensitive polymer and added with a solution of 2,4-di-(4'-azidobenzal)-4-methyl cyclohexanone in chlorobenzene as a diazide compound, which was applied on a silicon substrate to form a thin coating. The thickness of the coating before and after etching were measured.

Test etchant gases were CF$_4$, CF$_2$Cl$_2$, CCl$_4$, O$_2$ and Ar. The etching operation was carried in a parallel plate type etching apparatus. The results are shown in TABLE 5.

TABLE 5

| Run No. | Etchant | Pressure (m Torr) | Power (W) | Etching rate (nonameter/min) |
| --- | --- | --- | --- | --- |
| 1 | CF$_4$ | 20 | 100 | 400 |
| 2 | CF$_2$Cl$_2$ | 100 | 150 | 75 |
| 3 | CCl$_4$ | 200 | 150 | 20 |
| 4 | O$_2$ | 80 | 50 | 5 |
| 5 | Ar | 10 | 100 | 100 |

EXAMPLE 18

FIG. 1 shows the change in irradiation dose (mJ/cm$^2$) necessary for leaving 50% in thickness of the initial coatings in terms of the change in added quantity (mg) of a cross-linking agent, 2,6-di(4'-azidobenzal)-4-methyl cyclohexanone, added to the 20% substituted methacryloyloxymethyl polyphenylsiloxane. As shown in the Figure, the necessary irradiation dose is abruptly increased as the added quantity of the cross-linking agent is descreazed below 100 mg, but the change in necessary irradiation dose is no more increased as the added quantity exceeds 100 mg since the sensitivity are saturated with the cross-linking agent.

EXAMPLE 19

The 43% substituted methacryloyloxymethyl polyphenyl-silsesquioxane prepared by Example 7 was added with 5 wt % of 2,6-di-(4'-azidobenzal)-4-methyl cyclohexanone to prepare a composition which was used as an overcoat or top rsist coating material. On a silicon substrate having a top surface formed with silicon oxide was applied with a novolak resin AZ 1350J to form bottom resist layer having a thickness of 1 mm. The bottom resist layer was baked at a low temperature, i.e. at 80° C., for 30 minutes. The top resist coating material was disolved in chlorobenzene to prepare a 10 wt % solution which was applied over the bottom resist layer to form a 0.2 μm thick coating. After prebaking at 80° C. for 10 minutes, an UV light was irradiated on the coating through a photomask using an ultra high pressure mercury lamp at a rate of 50 mJ/cm$^2$. After irradiation, the top resist layer was developed by xylene for 10 seconds. Then, the top resist layer was rinsed with methyl cyclohexane for 20 seconds to form a pattern on the top resist layer covering the bottom resist layer. No change was observed in the bottom resist layer during the development operation. Thereafter, the bottom resist layer, on which the pattern of top resist was formed, was treated with O$_2$ RIE to transfer the pattern of the top resist layer onto and through the bottom resist layer. A pattern having 0.8 μm wide lines and spaces could be formed. The silicon oxide was then subjected to dry etching while utilizing the pattern of the aforementioned doublelayered resist as a masking. After the completion of dry etching, the double layered resist could be completely removed from the substrate by treating with methyl isobutyl ketone.

EXAMPLE 20

The 20% substituted methacryloyloxymethyl polyphenyl-silsesquioxane prepared by Example 9 was added with 5 wt % of 2,6-di-(4'-azidobenzal)-4-methyl cyclohexanone to prepare a composition which was used as a top resist coating material. A 10 wt % top resist coating solution in chlorobenzene was prepared therefrom, similarly as in Example 19, and the coating solution was applied to the bottom resist layer to form a thin coating of 0.2 μm thickness. Similarly as in Example 19, an UV light was irradiated through a photomask, followed by development and rinsing to form a pattern of top resist on the bottom resist layer. Thereafter, the pattern of top resist was transferred onto and through the bottom resist layer by treating through O$_2$ RIE, whereby a pattern having 0.8 μm wide lines and spaces could be formed. After the silicon oxide was processed through dry etching while utilizing the double layered resist pattern as a masking, the resist layer was removed by the use of methyl ethyl ketone. No dregs of resist layers was observed on the substrate.

What is claimed is:

1. A photosensitive resin composition having a high sensitivity to ultra violet rays, a high resolution power, excellent oxygen reactive ion etching properties adapted for use for forming a pattern in a double layer resist system as a resist layer comprising:

(a) a substituted polyphenylsilsesquioxane represented by the following formula

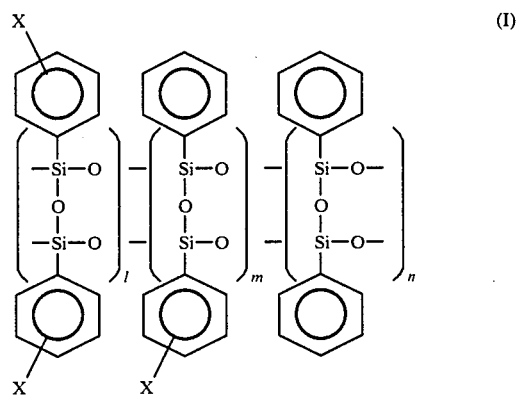

wherein X is acryloyloxymethyl, or methacryloyloxymethyl, and 1, m and n are zero or positive integers provided that 1 and m cannot both be zero; and wherein a substitution ratio by the substituent

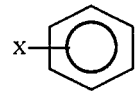

of said substituted polyphenylsilsesquioxane ranges between 10 to 50%, and (b) a bisazide compound selected from the group consisting of 2,6-di(4-azidobenzal)cyclohexanone, and 2,6-di(4-azidobenzal)4-methylcloohexanone wherein said bisazide compound is present in an amount of from 0.5 to 30 wt % based on the weight of said substituted polyphenylsilsesquioxane.

2. The photosensitive resin composition according to claim 1, wherein aid substituted polyphenylsilsesquioxane is methacryloyloxymethyl polyphenylsilsesquioxane wherein said substitution ratio is 45% and said bisazide compound is 2,6-di(4-azidobenzal) 4-methylcyclohexanone and is present in an amount of 5 wt %.

3. The photosensitive resin composition according to claim 1, wherein said substituted polyphenylsilsesquioxane is methacryloyloxymethyl polyphenylsilsesquioxane having said substitution ratio of 43% and said bisazide compound is 2,6-di(4-azidobenzal)4-methylcyclohexanone and is present in an amount of 5wt %.

4. The photosensitive resin composition according to claim 1, further comprising a sensitizer selected from the group consisting of aromatic carbonyl compounds, benzoin compounds, pigment redox compounds, azo-compounds, sulfur-containing compounds, organic peroxides, aromatic nitro-compounds, quinone compounds, anthrone compounds and acenaphthene compounds.

5. The photosensitive resin composition according to claim 1, further comprising a sensitizer selected from the group consisting of Michler's ketone and 1-nitropyrene.

* * * * *